(12) United States Patent
Kojima et al.

(10) Patent No.: US 6,576,552 B2
(45) Date of Patent: Jun. 10, 2003

(54) METHOD FOR POLISHING SEMICONDUCTOR DEVICE

(75) Inventors: Hiroyuki Kojima, Kawasaki (JP); Hidemi Sato, Yokohama (JP); Tetsuo Ookawa, Yokohama (JP); Mariko Urushibara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/103,689

(22) Filed: Mar. 25, 2002

(65) Prior Publication Data

US 2002/0098698 A1 Jul. 25, 2002

Related U.S. Application Data

(63) Continuation of application No. 10/062,668, filed on Feb. 5, 2002, which is a continuation of application No. 09/308,184, filed as application No. PCT/JP97/04172 on Nov. 17, 1997.

(30) Foreign Application Priority Data

Nov. 18, 1996 (JP) .............................. 08-306160

(51) Int. Cl.$^7$ ............................................. H01L 21/302
(52) U.S. Cl. ......................................... 438/691; 216/88
(58) Field of Search .................... 438/691–693; 451/35–36; 216/88; 156/345

(56) References Cited

U.S. PATENT DOCUMENTS

| 4,821,466 A | 4/1989 | Kato et al. |
| 5,051,378 A | 9/1991 | Yagi et al. |
| 5,234,867 A | 8/1993 | Schultz et al. |
| 5,449,313 A | 9/1995 | Kordonsky et al. |
| 5,575,706 A | 11/1996 | Tsai et al. |
| 5,911,619 A * | 6/1999 | Uzoh et al. ............ 451/5 |
| 6,297,159 B1 * | 10/2001 | Paton ................ 438/693 |

FOREIGN PATENT DOCUMENTS

| JP | 4-135167 | 5/1992 |
| JP | 5-53854 | 7/1993 |
| JP | 5-185357 | 7/1993 |

OTHER PUBLICATIONS

Microfilm of the specification and drawings annexed to the request of Japanese Utility Model/Application No. 112135/1991, (Laid–open No. 53854/1993), Casio Computer Co. Ltd., Jul. 20, 1993, pp. 1, 2.

* cited by examiner

*Primary Examiner*—David Nelms
*Assistant Examiner*—David Vu
(74) *Attorney, Agent, or Firm*—Antonelli, Terry, Stout & Kraus, LLP

(57) ABSTRACT

To provide a method having stable high polishing efficiency in the CMP of an LSI wafer and means for reducing the amount of use of consumable items such as a polishing liquid and a pad, an electric field is applied to the abrasive grains on a pad to attract the abrasive grains into a diffusion layer in the polishing liquid solvent near the surface of the pad, thereby holding the abrasive grains in the diffusion layer.

7 Claims, 4 Drawing Sheets

METHOD FOR POLISHING SEMICONDUCTOR DEVICE

This application is a Continuation application of application Ser. No. 10/062,668, filed Feb. 5, 2002, which is a Continuation application of application Ser. No. 09/308,184, filed May 14, 1999, which is an application filed under 35 US 371 of International Application No. PCT/JP97/04172, filed Nov. 17, 1997.

TECHNICAL FIELD OF THE INVENTION

The present invention relates to a process technology for manufacturing a high-density semiconductor integrated circuit element, and in particular, to a wafer-polishing device for flattening the uneven surface of an isolation film or a metallic film deposited on a Si wafer by polishing In particular, the present invention provides a polishing method having higher stable polishing efficiency than ever by increasing a force for holding abrasive grains on a pad when the wafer is polished and a process for polishing an LSI wafer which can reduce the amount of use of a polishing liquid and a pad.

BACKGROUND ART

In a process for manufacturing the high-density semiconductor integrated circuit element, complex bumps and dips are produced on the surface of the LSI wafer by patterning the isolation film or the metallic film. However, when a successive patterning is performed thereon, there may be a case in which since the depth of focus does not have an allowance for the bumps and dips in an exposure process and hence resolution becomes insufficient or a defect is produced on a metallic wiring film at the stepped part of the bumps and dips, a desired high-density semiconductor integrated circuit can not be made. In order to overcome this drawback, a start has been made at using a CMP method in which the LSI wafer is slid with the surface of the LSI wafer pressed onto the turn table on which the pad is placed and in which polishing slurry is poured into a sliding surface to polish and flatten the bumps and dips formed on the LSI wafer.

In the CMP method, a polishing action is performed by the abrasive grains held by the microscopic pits and projections on the pad. Since the amount of polishing per unit time, that is, polishing efficiency becomes higher as the number of abrasive grains held by the pad is larger, the surface of the pad used in the CMP method is shaped into a form for holding the abrasive grains easily. To be more specific, the structure of the pad is made porous and further the surface of the porous pad is dressed with a diamond grinder, whereby the pits and projections on the surface of the pad are controlled to a certain size suitable for holding the abrasive grains.

However, since the microscopic pits and projections on the surface of the pad are abraded as the polishing actions are repeated, the number of abrasive grains held by the pad is decreased and polishing efficiency is reduced. In order to solve this problem, in the conventional CMP method, the pad is dressed every an arbitrary number of wafers. However, there exists a following problem: since the surface of the pad can not be well reproduced after dressing, it is necessary to measure and correct the polishing efficiency, which makes the control of the amount of polishing extremely troublesome. Further, there exists another problem that since the pad is ground to produce a new surface, the consumption of the pad becomes excessive.

On the other hand, in the conventional CMP method, a reduction in the amount of use of slurry is essential The amount of supply of slurry is about 100 to 200 ml/min, but the number of acting abrasive grains estimated from the polishing efficiency is less than 20% of the number of abrasive grains contained by the slurry. If the number of abrasive grains held by the slurry is increased, the amount of use of slurry is decreased. However, it is considered difficult to increase the number of abrasive grains held by the slurry by holding the abrasive grains with the pits and projections on the conventional pad.

The problem described above is ascribable to holding the abrasive grains with the microscopic pits and projections on the pad. Therefore, in order to solve the problem, it is considered necessary to use another principle such as electrostatic force for holding the abrasive grains.

A method for holding the abrasive grains on the surface of the pad by using the electrostatic force is disclosed in Japanese Unexamined Patent No. 62-8566. The object of the invention is to eliminate low polishing efficiency in a non-contact polishing method. In the invention, an extremely light load of about 10 to 40 gf/cm$^2$ is applied to the surface of a work and, in order to put the abrasive grains into soft contact with the work, a soft pad such as fine woolly structure or foamed polyurethane having low hardness is used as a body for holding the abrasive grains. Therefore, there exist a problem that although the roughness of the surface of the work is good, this constitution as it is, is not sufficient in the ability of flattening the bumps and dips on the work which is required in the CMP.

It is the object of the present invention to provide means for improving and stabilizing polishing efficiency in the CMP of the LSI wafer and for reducing the amount of use of the polishing liquid and the pad by increasing the force for holding the abrasive grains on the pad.

DISCLOSURE OF THE INVENTION

An electric field is applied to the abrasive grains on the pad to attract the abrasive grains into a diffusion layer in a polishing liquid solvent near the surface of the pad, thereby holding the abrasive grains in the diffusion layer. A resin plate made of non-foamed material and having flatness and rigidity is used as the pad.

BEST MODE FOR CARRYING OUT THE INVENTION

The present invention will be hereinafter described with the reference to the drawings.

Figure 1:
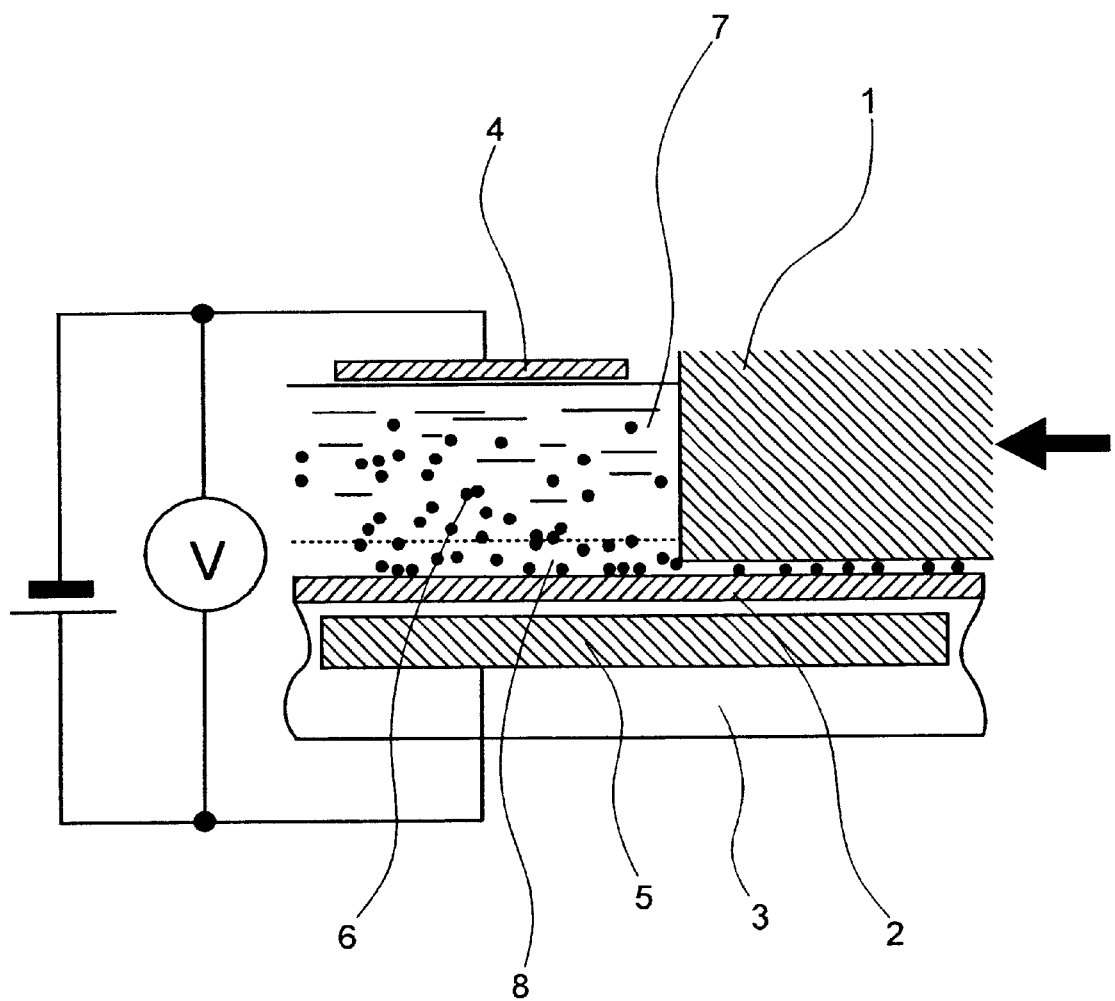
FIG. 1 is an illustration of a principle of polishing according to the present invention.

FIG. 1 is an illustration of a principle of polishing according to the present invention. Numeral 1 designates an LSI wafer; 2, a pad; and 3, a turn table. The pad 2 is placed on the turn table 3 and is slid on the LSI wafer 1. Further, numerals 4 and 5 designate electrode plates; 6, an abrasive grain; 7, a polishing liquid solvent; and 8, the diffusion layer of the polishing liquid solvent near the surface of the pad 2.

In this respect, the electrode plate 5 is made an anode and a direct current voltage is placed between the electrode plate 5 and the electrode plate 4 to generate an electric field. In this connection, since the abrasive grains 6 in the polishing liquid 7 are negatively charged, they are attracted to the electrode plate 5 side of the anode, that is, the surface of the pad 2 and are moved into the diffusion layer 8. Since the moving velocities of the abrasive grains 6 in the diffusion layer 8 depend on a diffusion velocity, the abrasive grains 6 can not be easily separated from the surface of the pad 2. Therefore, the abrasive grains 6 are moved with the rotation of the pad 2 and act on the surface of the LSI wafer to which a polishing load is applied.

As described above, in the present polishing method, it is not a force applied to the abrasive grains by an electric field but a low degree of movement of colloidal particles in the diffusion layer 8 that is used for holding the abrasive grains and hence it is not necessary to place the electric field continuously. Therefore, it is not necessary that the electrode plate 4 and the electrode plate 5 are plate electrodes opposite to each other, which produces a high degree of flexibility in space when the electrodes are arranged in the polishing device.

Further, since the abrasive grains 6 can be moved in the diffusion layer by the dielectric polarization of the abrasive grains 6, not only a unidirectional electric field but also a high frequency power source may be used as a power source for placing the electric field.

Figure 2:
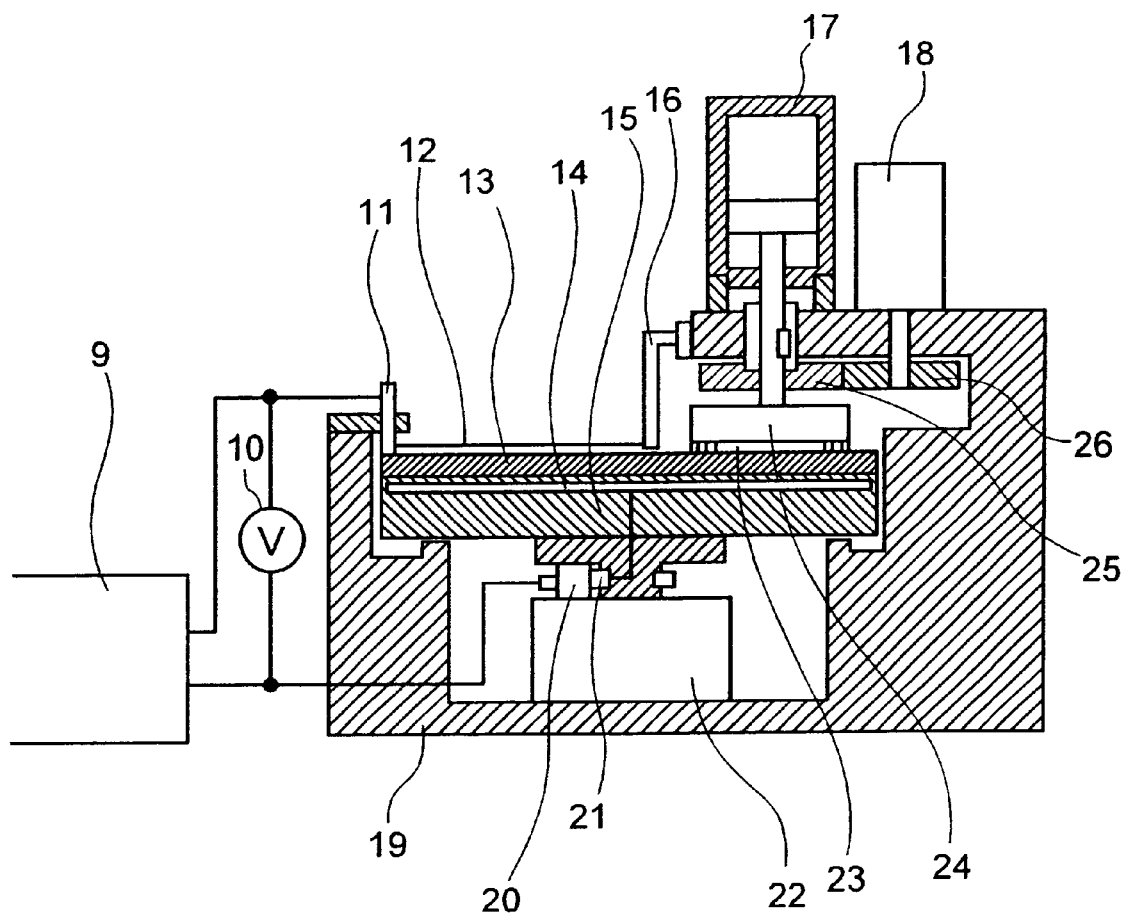
FIG. 2 is a constitution of a polishing device according to the present invention.

FIG. 2 is a constitution of a polishing device according to the present invention. In FIG. 2, a Si wafer 23 is held by a chuck 24 and a polishing load ranging from 10 kgf to 150 kgf is applied to the Si wafer by an air cylinder 17 mounted on a polishing machine body base 19. Further, the Si wafer can be rotated at the revolutions ranging from 10 to 100 rev/min by a wafer-twisting motor 18 via a chuck 24 and reduction gears 25 and 26. A pad 13 is placed on a turn table 15 made of ceramics and having a diameter of 600 mm and can be rotated at the revolutions ranging from 10 to 100 rev/min by a turn-table driving motor 22.

An electrode plate 14 made of stainless steel is buried in the surface plate 15 and is connected to a direct-voltage-stabilizing power source 9 via a slip ring 21 and a brush 20. Further, a wire-shaped electrode 12 covered with Teflon is extended above the pad 13 across a radius thereof by a support arms 11 and 16 and is connected to the DC voltage stabilizing power source 9 at the end of the outer peripheral side. A distance between the electrode plate 14 and the wire-shaped electrode 12 is 10 mm. The output voltage of the DC voltage stabilizing power source 9 can be controlled in the range from 0 to 300 V and the output voltage can be read with a voltmeter 10. Further, the output polarity of the DC voltage stabilizing power source 9 can be reversed. In this respect, the polishing liquid and pure water can be supplied to the pad 13 at an arbitrary position from a nozzle not shown.

Figure 3:
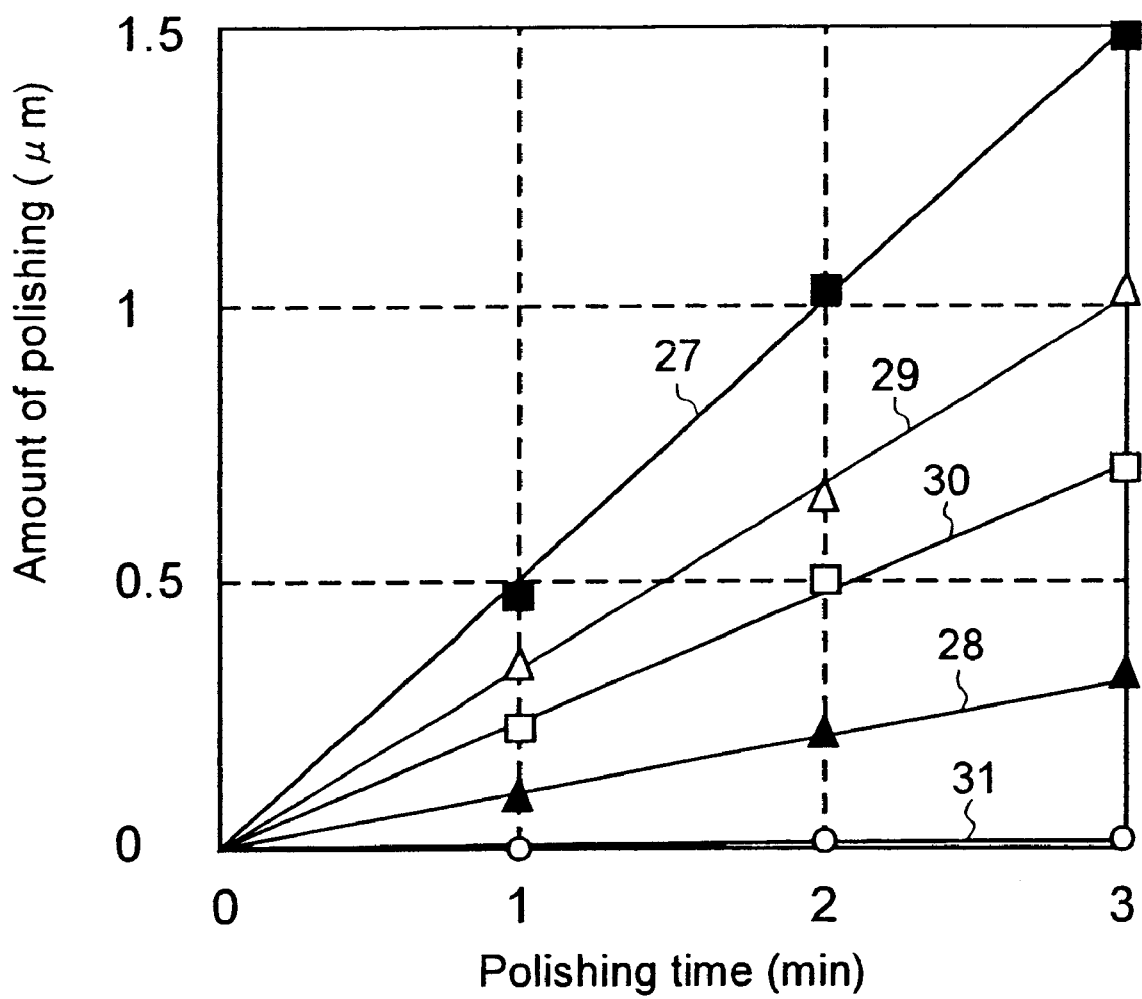
FIG. 3 is an illustration of a relationship between polishing time and the amount of polishing under various polishing conditions.

An experiment was conducted with the use of the polishing device described above and a comparison was made between the present invention and a conventional method. A Si wafer having a diameter of 150 mm to which liquid glass was applied while it was being rotated and which was heat-treated to form a Si oxide film of about 2 $\mu$m in thickness was used as a test sample. FIG. 3 is an illustration of a relationship between a polishing time and the amount of polishing. In FIG. 3, numeral 27 shows the results obtained from the experiment in which the test sample was polished under the conditions that a water solution having a SiO2 abrasive grain concentration of 3% was supplied at the rate of 100 ml/min to the pad 13 made of non-foamed polyurethane having a compression modulus of elasticity of 100 Mpa and a thickness of 1 mm and that a voltage of 200 V was placed across the electrodes, the electrode 14 being made an anode. A pressing pressure of the Si wafer onto the turn table was 500 g/cm$^2$ and the sliding speed of the surface plate at the center of the Si wafer was 300 mm/sec. Further, the Si wafer was rotated at 20 rev/min. Further, numeral 28 shows the results obtained from the experiment in which, in the conditions of the case designated by the numeral 27, the pad 13 was exchanged to the pad made of foamed polyurethane used in the conventional CMP and in which voltage was not placed between the electrodes. As is evident from the drawing, in the conventional method, the amount of polishing was about 0.3 $\mu$m for a polishing time of 3 min, whereas the amount of polishing was 1.5 $\mu$m in the present invention, that is, 5 times the amount in the conventional method. Therefore, assuming that the amount of polishing is the same in the present invention and in the conventional method, the polishing time can be shortened in one fifth by the present invention compared with the conventional method and the amount of use of the polishing liquid can be also reduced. Further, in FIG. 3, numerals 29 and 30 show the results obtained from the experiments in which, in the conditions of the case designated by the numeral 27, the voltage placed between the electrodes was changed to 100 V and 50 V, respectively. In this case, the amount of polishing for the polishing time of 3 min was about 1.0 $\mu$m and 0.7 $\mu$m, which makes it clear that polishing efficiency can be controlled by the voltage placed between the electrodes.

Further, numeral 31 shows the results obtained from the experiment in which the abrasive grains were removed from the pad 13 by reversing the polarity of the voltage placed between the electrodes. In the experiment, first, the test sample was polished under the conditions of numeral 27, and then while pure water was being supplied to the pad 13 at the rate of 150 ml/min, a voltage of 200 V was placed between the electrodes for 30 sec., the electrode 14 being made a cathode, thereby removing the abrasive grains. Then, the polarity of the voltage placed between the electrodes was reversed and then the next wafer was polished while the pure water was being supplied. It is clear from the results designated by numeral 31 that the wafer was not polished and that the abrasive grains were sufficiently removed.

Figure 4:
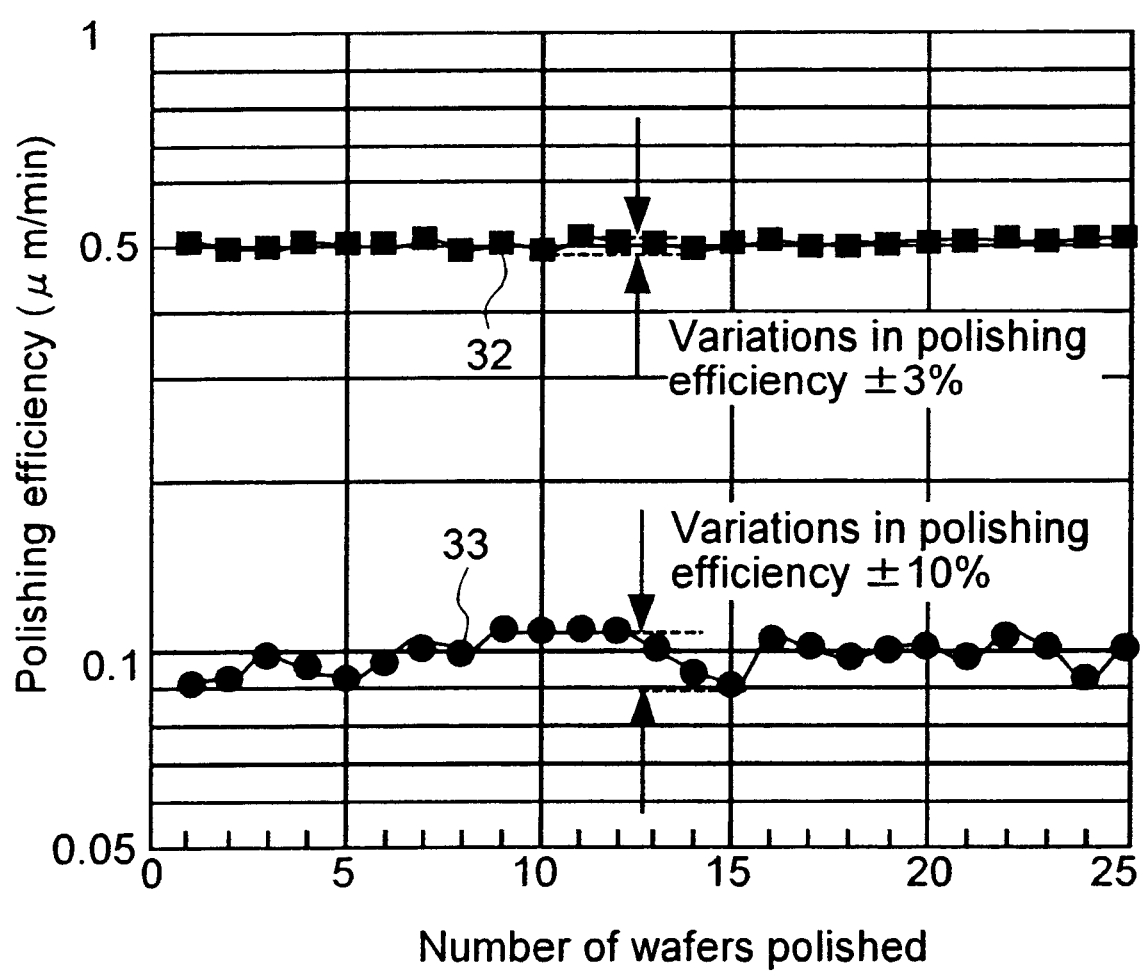
FIG. 4 shows a comparison in variations in polishing efficiency with the number of wafers polished between the present invention and a conventional method.

Next, in order to compare the present invention with the conventional method in the variations of the polishing efficiency of the wafer, twenty-five wafers were polished continuously under the polishing conditions of numeral 27 and under the conditions of numeral 28. In this connection, in the conventional method, in order to reduce the variations in the polishing efficiency, the pad was dressed every time the wafer was polished. The polishing efficiency was measured with the use of a thin film thickness gage Nanospec 4100 made by Nanomertix Co in U.S.A as follows: the thickness of the Si oxide film was measured before and after polishing and a difference in the thickness of the Si oxide film before and after the polishing was divided by the polishing time. The results are shown in FIG. 4. In FIG. 4, numeral 32 is the results of the present invention and numeral 33 is the results of the conventional method. It is apparent that while the variations in the polishing efficiency are about ±10% in the conventional method, the variations in the polishing efficiency were reduced to about ±3% in the present invention. Further, while the pad 13 was consumed because of dressing and was required to be replaced every one hundred wafers in the conventional method, the pad 13 was scarcely consumed in the present invention.

INDUSTRIAL APPLICABILITY

The maximum effect obtained from the present invention lies in stably producing high polishing efficiency in the CMP. Further, other additional effects are a reduction in use of the consumable items such as the polishing liquid and the pad, and an improvement in availability which is produced by a reduction in the frequency of maintenance.

What is claimed is:

1. A method for polishing a semiconductor device, comprising:

applying an electric field to abrasive grains in a polishing slurry, the abrasive grains having a first charge of a first polarity, the electric field being applied by two electrodes, one of the two electrodes being positioned at a turntable supporting a polishing pad during polishing, the other of the two electrodes being positioned at a pressing head so as to apply the electric field to the abrasive grains, a polarity of the voltage between the two electrodes being so as to attract the abrasive grains to the surface of the polishing pad; and polishing said semiconductor device by pressing the surface of a semiconductor device onto the polishing pad.

2. A method for polishing a semiconductor device as claimed in claim 1, wherein the electric field is applied to the abrasive grains by an electrode pattern, positioned at the turntable, as the one of the two electrodes, and a wire-shaped electrode pattern, positioned at the pressing head, as the other of the two electrodes.

3. A method for polishing a semiconductor device as claimed in claim 1, wherein at least a surface of said polishing pad is covered by the polishing slurry.

4. A method for polishing a semiconductor device as claimed in claim 1, wherein the polishing pad is a resin plate made of non-foamed material.

5. A method for polishing a semiconductor device as claimed in claim 1, wherein said one of the two electrodes extends substantially under an entirety of the polishing pad.

6. A method for polishing a semiconductor device, comprising:

applying an electric field to abrasive grains in a polishing slurry, the abrasive grains having a first charge of a first polarity, the electric field being applied by two electrodes, one of the two electrodes being positioned at a turntable supporting a polishing pad during polishing, the other of the two electrodes being positioned at a pressing head so as to move said abrasive grains toward the surface of said polishing pad; and pressing the surface of a semiconductor device onto said polishing pad having a high density of the abrasive grains so as to polish said semiconductor device.

7. A method for polishing a semiconductor device as claimed in claim 6, wherein the two electrodes are positioned so as to move the abrasive grains to the surface of the polishing pad.

* * * * *